United States Patent
Xiao et al.

(10) Patent No.: US 12,550,311 B2
(45) Date of Patent: Feb. 10, 2026

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 745 days.

(21) Appl. No.: 17/817,405

(22) Filed: Aug. 4, 2022

(65) Prior Publication Data
US 2023/0171938 A1 Jun. 1, 2023

(30) Foreign Application Priority Data
Nov. 30, 2021 (CN) .......................... 202111440472.5

(51) Int. Cl.
*H10B 12/00* (2023.01)
*H10D 30/63* (2025.01)

(52) U.S. Cl.
CPC ....... *H10B 12/0383* (2023.02); *H10B 12/482* (2023.02); *H10B 12/488* (2023.02); *H10D 30/63* (2025.01)

(58) Field of Classification Search
CPC H10B 12/0383; H10B 12/482; H10B 12/488; H10D 30/63
See application file for complete search history.

(56) References Cited

U.S. PATENT DOCUMENTS

| 9,112,032 B1 | 8/2015 | Liu et al. |
| 9,318,576 B2 | 4/2016 | Park |
| | (Continued) | |

FOREIGN PATENT DOCUMENTS

| CN | 104425608 A | 3/2015 |
| CN | 108389896 A | 8/2018 |
| | (Continued) | |

OTHER PUBLICATIONS

First Office Action cited in CN202111444498.7 mailed May 16, 2022, 23 pages.

(Continued)

*Primary Examiner* — Richard A Booth
(74) *Attorney, Agent, or Firm* — Kilpatrick Townsend & Stockton LLP

(57) ABSTRACT

The present disclosure provides a manufacturing method of a semiconductor structure and a semiconductor structure. The manufacturing method of a semiconductor structure includes: providing a substrate; forming a plurality of active pillars arranged in an array on the substrate, where the active pillar includes a first segment, a second segment, and a third segment that are connected sequentially, and along a second direction, a cross-sectional area of the second segment is smaller than those of the first segment and the third segment; forming a gate oxide layer on a sidewall of the second segment, a top surface of the first segment, and a bottom surface of the third segment; and forming a gate dielectric layer on the gate oxide layer, where the gate dielectric layer is shorter than the gate oxide layer, and is close to the third segment.

12 Claims, 10 Drawing Sheets

(56) References Cited

U.S. PATENT DOCUMENTS

| | | | |
|---|---|---|---|
| 12,349,332 B2* | 7/2025 | Xiao | ................ H10B 12/05 |
| 2006/0043472 A1 | 3/2006 | Wang et al. | |
| 2007/0082448 A1 | 4/2007 | Kim et al. | |
| 2011/0121396 A1 | 5/2011 | Lee | |
| 2021/0296316 A1 | 9/2021 | Zhu | |
| 2023/0028597 A1* | 1/2023 | Wang | ................ H10B 12/482 |
| 2023/0032102 A1* | 2/2023 | Mei | ................ H10B 12/34 |

FOREIGN PATENT DOCUMENTS

| | | | |
|---|---|---|---|
| CN | 108807545 A | 11/2018 |
| CN | 109449158 A | 3/2019 |
| CN | 109841522 A | 6/2019 |
| CN | 109979880 A | 7/2019 |
| CN | 113611671 A | 11/2021 |

OTHER PUBLICATIONS

International Search Report cited in PCT/CN2022/077639 mailed May 19, 2022, 9 pages.
International Search Report cited in PCT/CN2022/077681 mailed Aug. 9, 2022, 8 pages.

* cited by examiner

MANUFACTURING METHOD OF SEMICONDUCTOR STRUCTURE AND SEMICONDUCTOR STRUCTURE

CROSS-REFERENCE TO RELATED APPLICATION

This application claims the priority of Chinese Patent Application No. 202111440472.5, submitted to the Chinese Intellectual Property Office on Nov. 30, 2021, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate-induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure, including:
   providing a substrate;
   forming a plurality of active pillars on the substrate, where the active pillars are arranged in an array, the active pillar includes a first segment, a second segment, and a third segment that are sequentially connected along a first direction, and along a second direction, a cross-sectional area of the second segment is smaller than those of the first segment and the third segment;
   forming a gate oxide layer on a sidewall of the second segment, a top surface of the first segment, and a bottom surface of the third segment; and
   forming a gate dielectric layer on the gate oxide layer, where along the first direction, the gate dielectric layer is shorter than the gate oxide layer, and is close to the third segment.

A second aspect of the present disclosure provides a semiconductor structure, including:
   a substrate;
   a plurality of active pillars, arranged in an array in the substrate, where the active pillar includes a first segment, a second segment, and a third segment that are connected sequentially along a first direction, and along a second direction, a cross-sectional area of the second segment is smaller than those of the first segment and the third segment;
   a gate oxide layer, disposed on a sidewall of the second segment, a top surface of the first segment, and a bottom surface of the third segment; and
   a gate dielectric layer, disposed outside the gate oxide layer, where along the first direction, the gate dielectric layer is shorter than the gate oxide layer, and is close to the third segment.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In the related art, the transistor can be understood as a current switch structure made of a semiconductor material. A metal gate is disposed between the source and the drain of the transistor, and the metal gate can be used to control on/off of a current between the source and the drain. A gate-all-around (GAA) transistor is made by using a GAA technology. With the development of semiconductor processes, a size of a semiconductor device is becoming smaller. In addition, GIDL occurs in a process of forming a structure of the GAA transistor, reducing performance and a yield of the semiconductor structure.

In order to resolve one of the foregoing technical problems, an exemplary embodiment of the present disclosure provides a manufacturing method of a semiconductor structure. The following describes the manufacturing method of a semiconductor structure with reference to FIGS. 1 to 24.

There are no limits made on the semiconductor structure in the embodiments. The semiconductor structure is described below by using a DRAM as an example, but is not limited thereto in the embodiments. Alternatively, the semiconductor structure in the embodiments may be another structure, for example, a GAA transistor or a vertical gate-all-around (VGAA) transistor.

Figure 1:
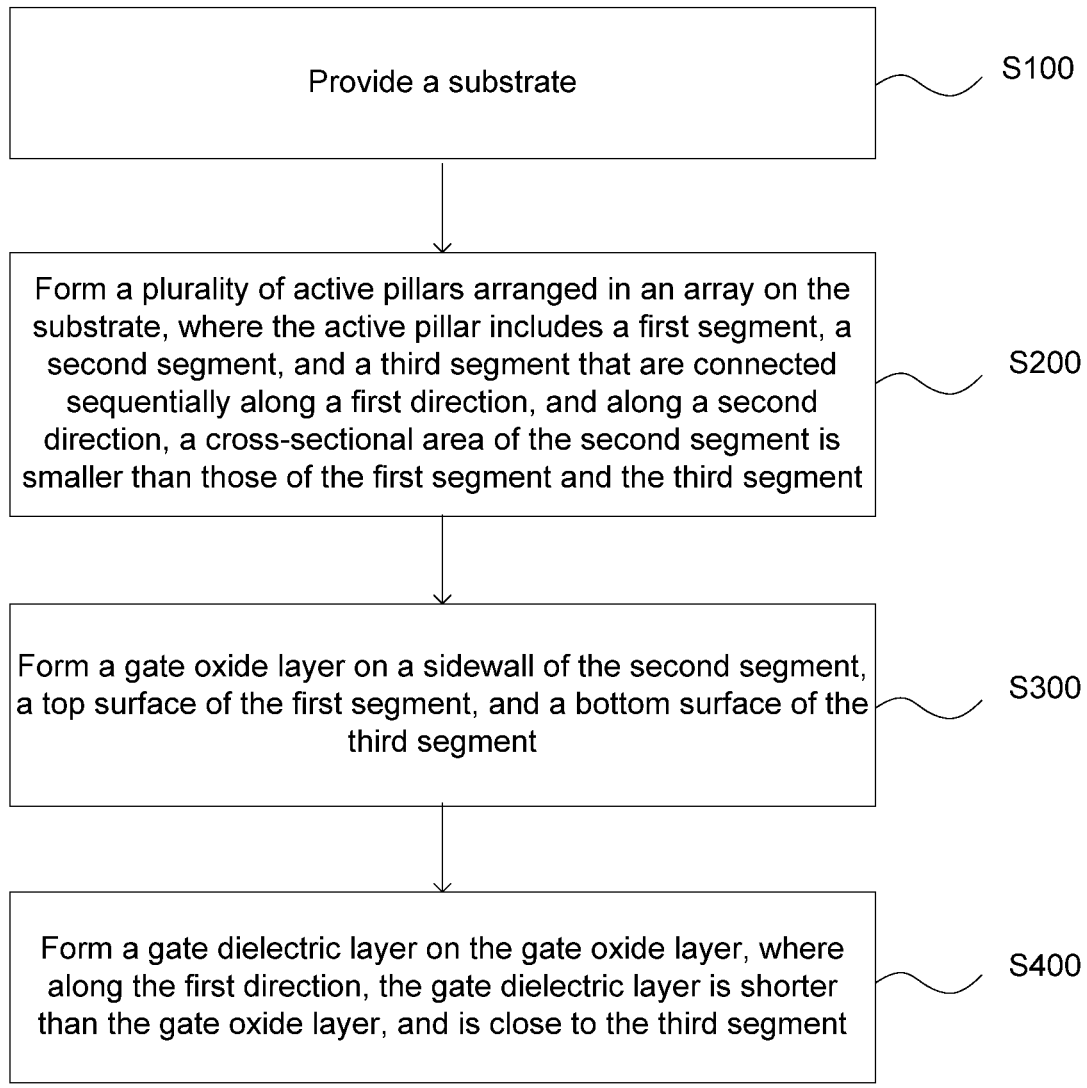
FIG. 1 is a flowchart of a manufacturing method of a semiconductor structure according to an exemplary embodiment.

As shown in FIG. 1, an exemplary embodiment of the present disclosure provides a manufacturing method of a semiconductor structure, including the following steps:

Step S100: Provide a substrate.

Step S200: Form a plurality of active pillars arranged in an array on the substrate, where the active pillar includes a first segment, a second segment, and a third segment that are connected sequentially along a first direction, and along a second direction, a cross-sectional area of the second segment is smaller than those of the first segment and the third segment.

Step S300: Form a gate oxide layer on a sidewall of the second segment, a top surface of the first segment, and a bottom surface of the third segment.

Step S400: Form a gate dielectric layer on the gate oxide layer, where along the first direction, the gate dielectric layer is shorter than the gate oxide layer, and is close to the third segment.

In this embodiment, the gate oxide layer is formed on the sidewall of the second segment, the top surface of the first segment, and the bottom surface of the third segment of the active pillar, and then the gate dielectric layer is formed on the sidewall of the gate oxide layer. The gate dielectric layer is shorter than the gate oxide layer, and the gate dielectric layer is close to the third segment, such that two ends of the second segment have different capacitances, to have different potentials, which is beneficial to controlling the turn-off current of the semiconductor structure, and reducing the problems of GIDL current and inter-band tunneling, thereby effectively improving the performance and yield of the semiconductor structure.

According to an exemplary embodiment, this embodiment is a further description of step S100 described above.

Figure 2:
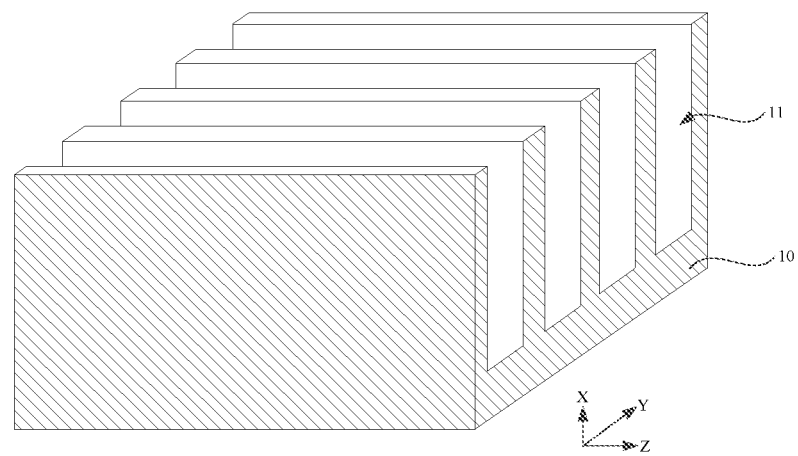
FIG. 2 is a schematic diagram of forming a strip body in the manufacturing method of a semiconductor structure according to an exemplary embodiment.

As shown in FIG. 2, in step S100, the substrate 10 serves as a support component of the DRAM and is configured to support other components provided thereon. The substrate 10 may be made of a semiconductor material. The semiconductor material may be one or more of silicon, germanium, a silicon-germanium compound, and a silicon-carbon compound. In this embodiment, the substrate 10 is made of silicon, to facilitate understanding of a subsequent forming method by those skilled in the art, rather than to constitute a limitation. In an actual application process, an appropriate material of the substrate may be selected as required.

According to an exemplary embodiment, this embodiment is a further description of step S200 described above.

Figure 3:
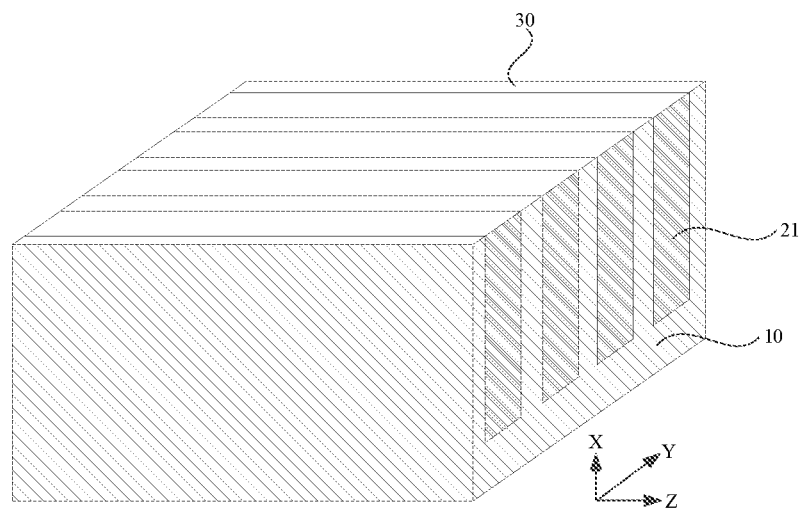
FIG. 3 is a schematic diagram of forming an initial bit line isolation structure in the manufacturing method of a semiconductor structure according to an exemplary embodiment.

As shown in FIGS. 2 and 3, in step S200, the following method can be used to form the active pillars arranged in an array on the substrate 10.

As shown in FIG. 2, a plurality of bit line trenches 11 arranged at intervals along the second direction Y are formed in the substrate 10, and each extend along the third direction Z.

In this embodiment, with reference to FIG. 2, in the description in this embodiment, taking the orientation shown in the figure as an example, the second direction Y is the extension direction perpendicular to the front side of the substrate 10, that is, the direction Y in FIG. 2. The third direction Z is an extension direction parallel to a front side face of the substrate 10. The second direction Y intersects the third direction Z on a same horizontal plane. The second direction Y may intersect the third direction Z at a predetermined angle. For example, the second direction Y is perpendicular to the third direction Z.

During the formation of the bit line trench 11, a first mask layer (not shown in the figure) may be formed on the substrate 10 first and then is patterned, such that a plurality of first openings arranged at intervals along the second direction are formed in the first mask layer, and each extend along the third direction Z.

With reference to FIG. 2, the patterned first mask layer is used as a mask to remove by a thickness the substrate 10 exposed in the first opening and to form a plurality of bit line trenches 11 in the substrate 10. The plurality of bit line trenches 11 are arranged at intervals along the second direction Y, and each extend along the third direction Z.

After the bit line trenches 11 are formed, as shown in FIG. 3, an insulating material is deposited into each bit line trench 11 by using the deposition process to form an initial bit line isolation structure 21 in each bit line trench 11, such that the substrate 10 between adjacent initial bit line isolation structures 21 forms a strip body 30. In other words, in this embodiment, the plurality of initial bit line isolation structures 21 are disposed to divide the substrate 10 into a plurality of independent strip bodies 30.

In this embodiment, the deposition process may include any one of an atomic layer deposition process, a chemical vapor deposition process, and a physical vapor deposition process.

In addition, the material of the initial bit line isolation structure 21 may include, but is not limited to, silicon oxide or silicon nitride. In some embodiments, the initial bit line isolation structure 21 may alternatively be an oxide-nitride-oxide (ONO) structure, but is not limited thereto.

In this embodiment, the initial bit line isolation structure 21 is formed in the substrate 10, to insulate adjacent bit lines subsequently formed in the substrate 10, thereby ensuring performance and a yield of a semiconductor structure.

Figure 4:
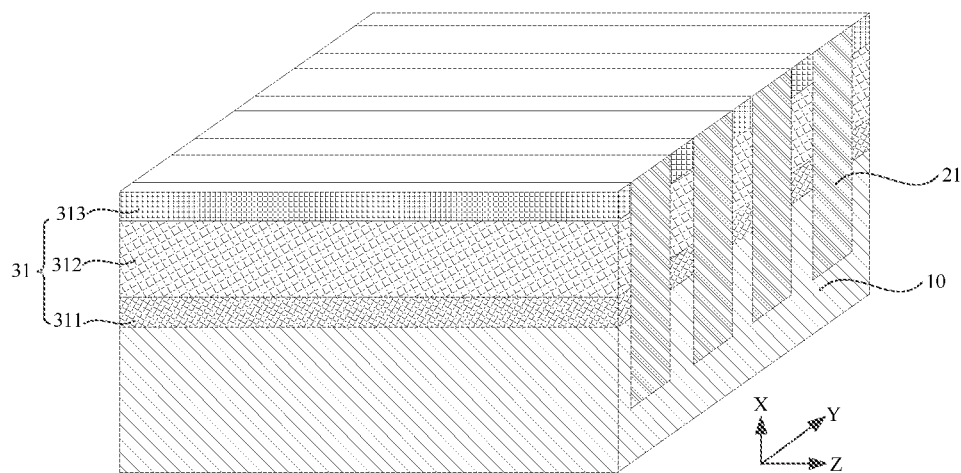
FIG. 4 is a schematic diagram of forming a silicon pillar structure in the manufacturing method of a semiconductor structure according to an exemplary embodiment.

As shown in FIG. 4, after the strip body 30 is formed, it is processed to form a silicon pillar structure 31. Along the first direction, the silicon pillar structure 31 includes a first part 311, a second part 312, and a third part 313. The first part 311 is connected to the substrate 10. The first direction X is perpendicular to the substrate 10. Taking the orientation shown in FIG. 4 as an example, the first direction X is the extension direction from the bottom surface of the substrate 10 to the top surface of the substrate 10.

In some embodiments, ions are implanted into the strip body 30. For example, ion implantation energy and a type of implanted doped ions in an ion implantation process can be controlled three times, to sequentially form the first part 311 at the bottom of the strip body 30, the second part 312 in the middle of the strip body 30, and the third part 313 at the top of the strip body 30. The three parts form a pillar structure 31.

The first part 311 and the third part 313 may be implanted with the same type of ions. For example, the doped ions may include N-type ions. The second part 312 and the first part 311 may be implanted with different ions, which, for example, may include P-type ions.

It should be noted that the first part 311 may be used as one of a source region or a drain region of the subsequently formed active pillar, the second part 312 may be used as a channel region, and the third part 313 may be used as the other of the source region or the drain region. For example, if the first part 311 is used as the source region, correspondingly, the third part 313 is used as the drain region.

Figure 5:
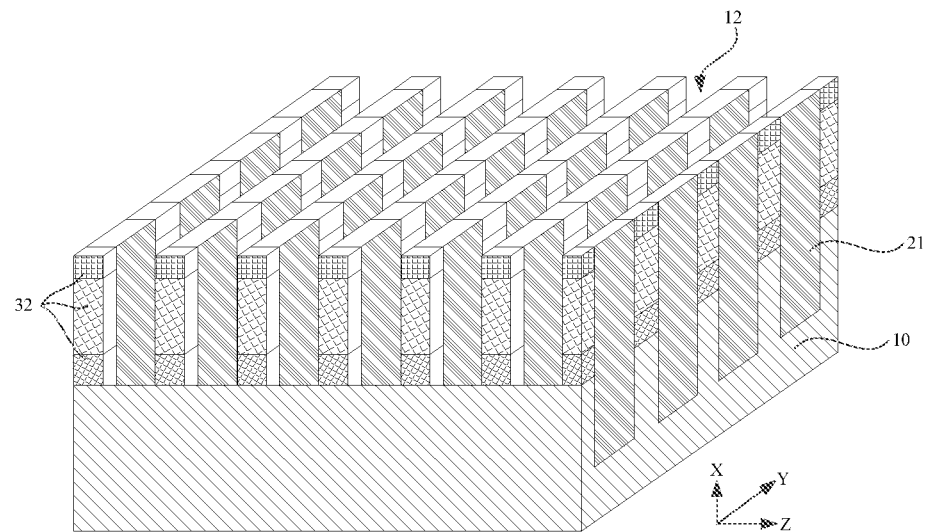
FIG. 5 is a schematic diagram of forming a silicon pillar in the manufacturing method of a semiconductor structure according to an exemplary embodiment.
Figure 6:
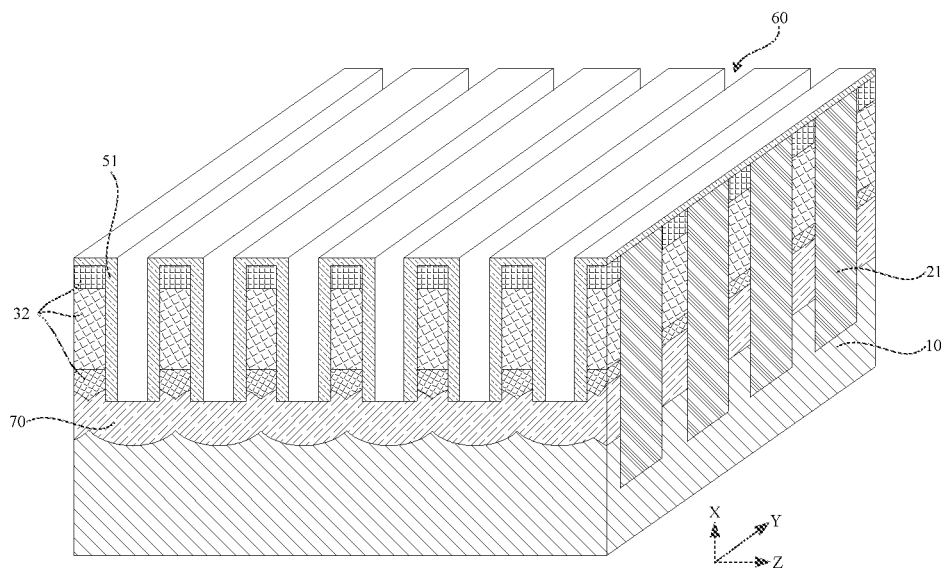
FIG. 6 is a schematic diagram of forming a first initial isolation layer in the manufacturing method of a semiconductor structure according to an exemplary embodiment.
Figure 7:
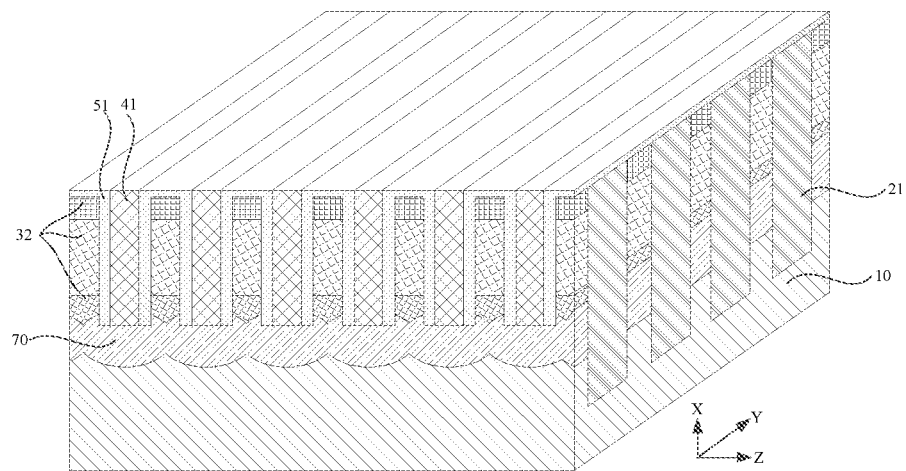
FIG. 7 is a schematic diagram of forming an initial word line isolation structure in the manufacturing method of a semiconductor structure according to an exemplary embodiment.

After the silicon pillar structure 31 is formed, as shown in FIGS. 5 to 7, a plurality of word line isolation structures 40 are formed in the substrate 10, and arranged at intervals along the third direction Z. The silicon pillar structure 31 between adjacent initial bit line isolation structures 21 and between adjacent word line isolation structures 40 form the silicon pillar 32. In other words, the plurality of word line isolation structures 40 divide each silicon pillar structure 31 into a plurality of silicon pillars 32.

During the formation of the word line isolation structure 40, a second mask layer (not shown in the figure) may be formed on the substrate 10 first and then is patterned, such that a plurality of second openings arranged at intervals along the third direction Z are formed in the second mask layer, and each extend along the second direction Y.

As shown in FIG. 5, the patterned second mask layer is used as a mask to remove by a thickness the substrate 10 exposed in the second opening, to form a plurality of word line trenches 12 in the substrate 10. The plurality of word line trenches 12 are arranged at intervals along the third direction Z, and each extend along the second direction Y. Along the first direction Z, the word line trench 12 is shallower than the bit line trench 11.

Then, as shown in FIG. 6, a first initial isolation layer 51 is formed on each of two sidewalls of the word line trench 12, extends outside the word line trench 12, and covers the top surface of the silicon pillar 32. A first trench 60 is formed between two adjacent first initial isolation layers 51, and partially exposes the substrate 10, to form the bit line 70 subsequently.

In this embodiment, the first initial isolation layer 51 is formed on the side surface and the top surface of the silicon pillar 32, and is configured to prevent another structure formed in the substrate 10 from causing damage to the silicon pillar 32. The first isolation layer 51 may be made of an insulating material such as silicon oxide or silicon nitride.

After the first trenches 60 are formed, with reference to FIG. 6, a plurality of bit lines 70 arranged at intervals along the second direction are formed at bottoms of the first trenches 60.

For example, cobalt (Co), a nickel platinum (NiPt) alloy, or the like may be implanted into the bottom of the first trench by using the ion implantation process. Under a reaction condition, the Co or the NiPt alloy reacts with silicon in the substrate to form cobalt silicide (CoSi) or platinum nickel silicide (PtNiSi). After annealing, the CoSi or the PtNiSi diffuses to a bottom surface of the active pillar in the substrate to form one bit line 70. The bit line 70 may be connected to first segments of a plurality of subsequently formed active pillars, along the third direction Z, in a same straight line.

The bit line forming method in this embodiment is simple and easy to control and operate. It should be noted that the bit line may be connected to the drain of the subsequently formed active pillar. In a transistor, a gate is connected to a word line, and a source is connected to a capacitor structure. A voltage signal on the word line can control the transistor to turn on or off, and then data information stored in the capacitor structure is read through the bit line, or data information is written into the capacitor structure through the bit line for storage.

After the bit line 70 is formed, as shown in FIG. 7, an insulating material is deposited in the first trench 60 by using a deposition process to form the initial word line isolation structure 41 in the first trench 60. The top surface of the initial word line isolation structure 41 is flush with the that of the first initial isolation layer 51.

For example, a material is used to fill the first trench 60 by using the atomic layer deposition process, the chemical vapor deposition process, or the physical vapor deposition process, to form the initial word line isolation structure 41. A top surface of the initial word line isolation structure 41 is flush with that of the first initial isolation layer 51. Proper filling materials include an insulating material. In some embodiments, the filling materials include a nitride, an oxide, a high-k dielectric material, or another proper insulating material.

Figure 8:
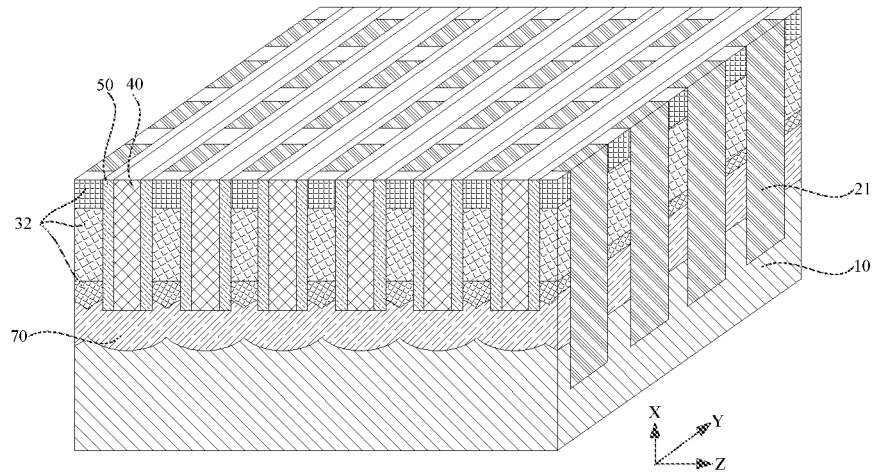
FIG. 8 is a schematic diagram of forming a word line isolation structure and a first isolation layer in the manufacturing method of a semiconductor structure according to an exemplary embodiment.

After the initial word line isolation structure 41 is formed, as shown in FIG. 8, by using the chemical mechanical polishing process, the first initial isolation layer 51 and the initial word line isolation structure 41 are partially removed. The first initial isolation layer 51 on each of the two sidewalls of the word line trench 12 is retained. The initial word line isolation structure 41 in the first trench 60 is retained. The retained first initial isolation layer 51 forms the first isolation layer 50. The retained initial word line isolation structure 41 forms the word line isolation structure 40. The word line isolation structure 40 is configured to insulate adjacent bit lines subsequently formed in the substrate 10, and ensure the performance and the yield of the semiconductor structure.

In this embodiment, through the chemical mechanical polishing, top surfaces of the first isolation layer 50, the word line isolation structure 40, and the silicon pillar 32 are flush with each other, thereby reducing defect density and improving the yield of the semiconductor structure.

After the word line isolation structure 40 is formed, the silicon pillar structure 31 between adjacent word line isolation structures 40 and between adjacent initial bit line isolation structures 21 forms the silicon pillar 32 on the substrate 10. It should be noted that the first part 311 of the silicon pillar structure 31 forms a lower segment of the silicon pillar 32, the second part 312 of the silicon pillar structure 31 forms a middle segment of the silicon pillar 32, and the third part 313 of the silicon pillar structure 31 forms an upper segment of the silicon pillar 32.

In some embodiments, after the silicon pillar 32 and the word line isolation structure 40 are formed, the manufacturing method of the semiconductor structure further includes:

forming a support structure 80, where the support structure 80 covers two sides of the word line isolation structure 40 and two sidewalls of the third part along the third direction Z. In this embodiment, the support structure 80 is disposed to improve accuracy of a structure such as the gate oxide layer formed subsequently.

Figure 9:
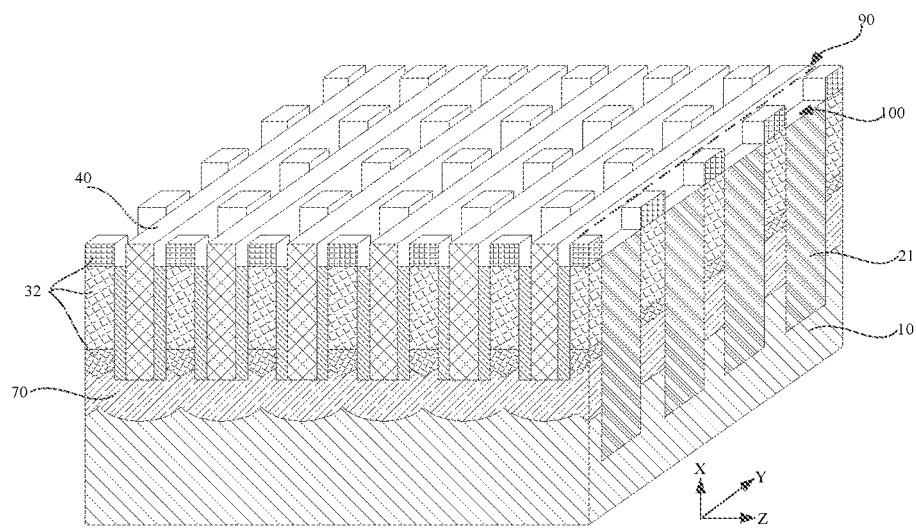
FIG. 9 is a schematic diagram of forming a first filling region and a second filling region in the manufacturing method of a semiconductor structure according to an exemplary embodiment.

In some embodiments, as shown in FIG. 9, the first isolation layer 50 and the initial bit line isolation structure 21 are partially removed, to partially expose the word line isolation structure 40 and the silicon pillar 32. A first filling region 90 is formed between the word line isolation structure 40 and the silicon pillar 32, and along the third direction, a gap between adjacent third segments forms a second filling region 100. Taking the orientation shown in FIG. 9 as an example, along the direction perpendicular to the substrate 10, the first isolation layer 50 and the initial bit line isolation structure 21 are partially removed by a thickness. The retained initial bit line isolation structure 21 forms a transition bit line isolation structure 22. The top surface of the transition bit line isolation structure 22 is flush with a bottom surface of the third part of the silicon pillar 32.

It should be noted that, from right to left, taking the first word line isolation structure 40 as an example, the first filling region 90 may be a region between the right side of the first word line isolation structure 40 and the dotted line. The second filling region 100 may be a region located on the right side of the dotted line, and between adjacent silicon pillars 32.

Then, an initial support structure (not shown in the figure) is formed in the first filling region 90 and the second filling region 100 through the atomic layer deposition process, the chemical vapor deposition process, or the physical vapor deposition process.

In some embodiments, the initial support structure may be deposited on the inner wall of the first filling region 90 and the inner wall of the second filling region 100 by using the atomic layer deposition process. The initial support structure extends outside the first filling region 90 and the second filling region 100, and covers the top surfaces of the silicon pillars 32 and the word line isolation structure 40.

Figure 10:
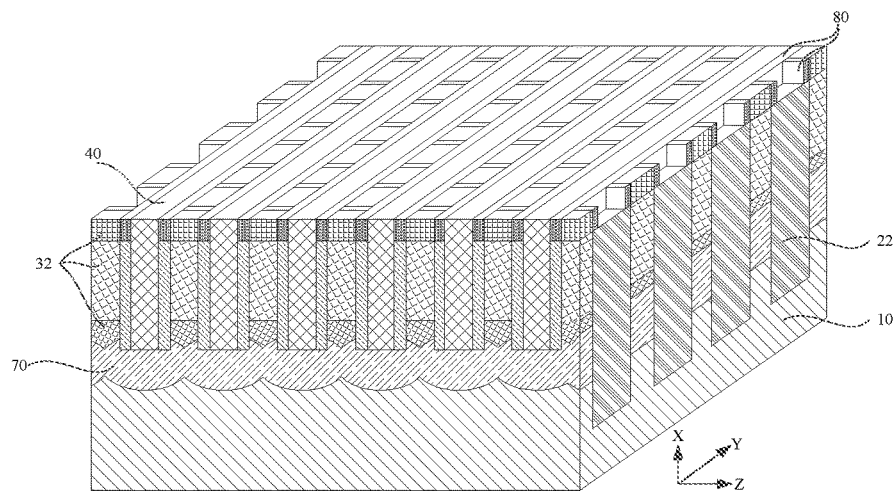
FIG. 10 is a schematic diagram of forming a support structure in the manufacturing method of a semiconductor structure according to an exemplary embodiment.

Then, with reference to FIG. 10, the top surface of the transition bit line isolation structure 22, that is, the initial support structure on the bottom wall of the second filling region 100, is removed through etching. Moreover, the initial support structure on the top surfaces of the silicon pillar 32 and the word line isolation structure 40 is removed. The initial support structure on the two sidewalls of the word line isolation structure 40, and on the sidewall of the third part of the silicon pillar 32 along the second direction Y is retained as the support structure 80. It should be noted that a material of the support structure 80 may include, but is not limited to, silicon nitride.

Taking the orientation shown in FIG. 10 as an example, the support structure 80 is partially disposed on the two sidewalls of the word line isolation structure 40 along the third direction Z, and is also partially disposed on the two sidewalls of the third part of the silicon pillar 32 along the second direction Y.

In this embodiment, the support structure 80 is formed by using the atomic layer deposition process. This can improve density of a film layer of the support structure 80 to prevent inclination of the third segment of the active pillar in a subsequent word line formation process, and ensure accuracy of the subsequently formed gate oxide layer, thereby improving the performance and the yield of the semiconductor structure.

After the support structure 80 is formed, the second part of the silicon pillar 32 is preprocessed to form the active pillar 110.

Figure 11:
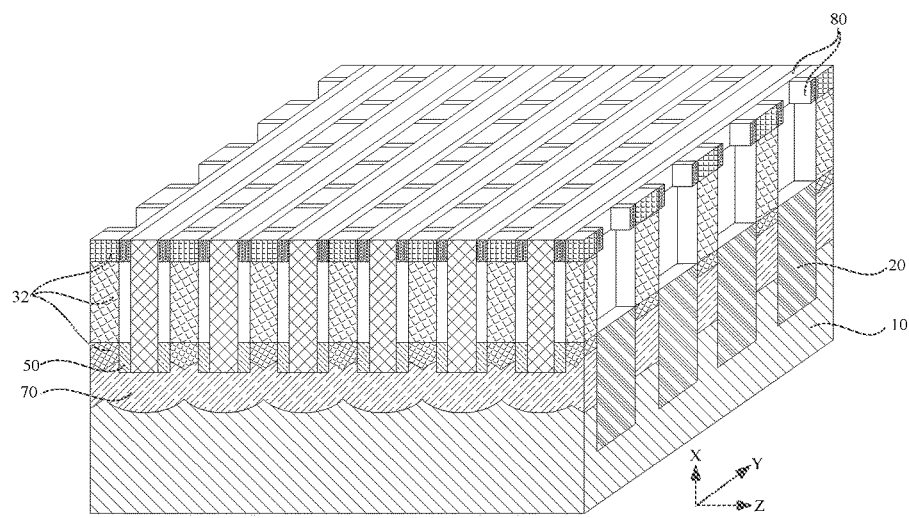
FIG. 11 is a schematic diagram of forming a bit line isolation structure in the manufacturing method of a semiconductor structure according to an exemplary embodiment.

In some embodiments, as shown in FIG. 11, the first isolation layer 50 and the bit line isolation structure 20 that are below the support structure are partially removed, to expose the second part of the silicon pillar 32. The top surface of the retained bit line isolation structure 20 is flush with the bottom surface of the second part of the silicon pillar 32.

Figure 12:
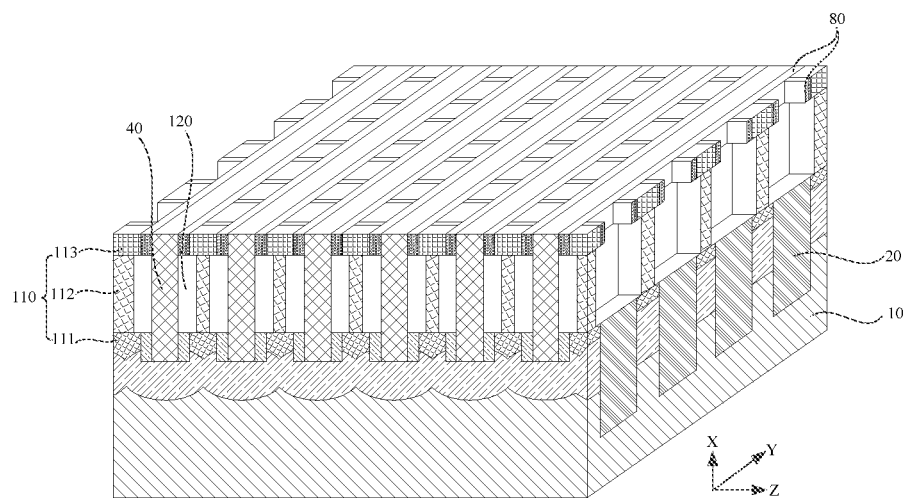
FIG. 12 is a schematic diagram of forming a second trench in the manufacturing method of a semiconductor structure according to an exemplary embodiment.

As shown in FIG. 12, the second part of the silicon pillar 32 is oxidized to partially remove the second part of the silicon pillar 32 to form the active pillar 110.

In an example, an oxidation process is performed on the second part of the silicon pillar 32 to partially oxidize the second part of the silicon pillar 32, such that silicon oxide of a thickness is formed on the peripheral surface of the silicon pillar. Then, the silicon oxide is removed through etching or cleaning, to make the silicon pillar 32 form the active pillar 110. In some embodiments, the oxidation processing includes thermal oxidation or steam oxidation. In the oxidation processing, the silicon pillar 32 is exposed outside. Through the thermal oxidation or steam oxidation, an oxide layer, such as silicon oxide, is formed on a surface of the silicon pillar 32, and then may be removed through etching or cleaning, thereby partially removing the second part of the silicon pillar 32. The second part of the silicon pillar 32 in this embodiment is the second part 312 of the silicon pillar structure 31 in the foregoing embodiment.

It should be noted that the first part of the silicon pillar 32 forms the first segment 111 of the active pillar 110. The retained second part of the silicon pillar 32 forms the second segment 112 of the active pillar 110. The third part of the silicon pillar 32 forms the third segment 113 of the active pillar 110, and the second trench 120 is formed between the second segment 112 and the word line isolation structure 40.

In this example, the second segment 112 may serve as a channel region of the active pillar 110, the first segment 111 may serve as one of the source and drain of the active pillar 110, and the third segment 113 may serve as the other. In an example, the first segment 111 of the active pillar 110 forms the drain, and the third segment 113 of the active pillar 110 forms the source.

Taking the section parallel to the substrate 10 as a cross section, the cross-sectional area of the second segment 112 is smaller than those of the first segment 111 and the third segment 113. In this way, the area of the channel region of the active pillar 110 can be reduced, which is beneficial to manufacturing the gate oxide layer subsequently, and can increase the area of the word line, thereby improving the transistor sensitivity.

According to an exemplary embodiment, this embodiment is a further description of step S300 described above.

In step S300, the gate oxide layer 130 is formed on the sidewall of the second segment 112, the top surface of the first segment 111, and the bottom surface of the third segment 113.

Figure 13:
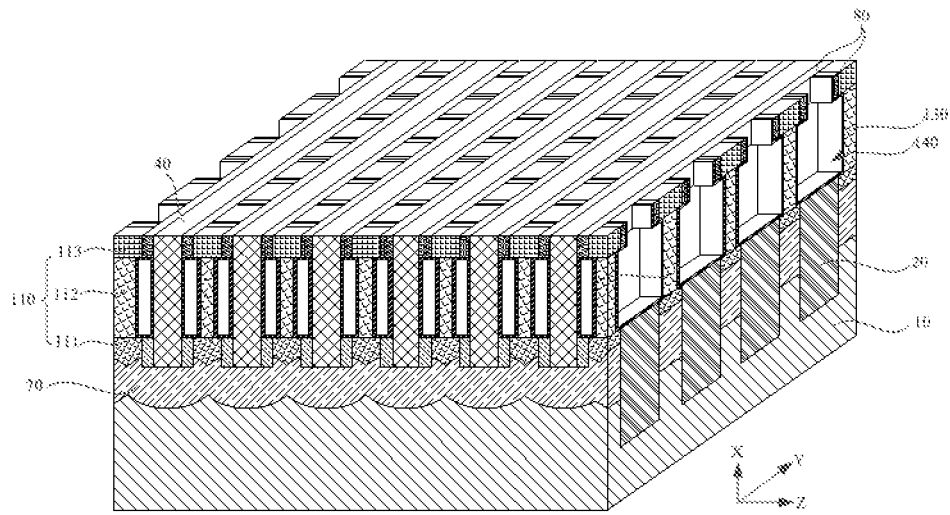
FIG. 13 is a schematic diagram of forming a gate oxide layer in the manufacturing method of a semiconductor structure according to an exemplary embodiment.

As shown in FIG. 13, the gate oxide layer 130 is formed on the sidewall of the second trench 120 by using the atomic layer deposition process, and the gate oxide layer 130 in the second trench 120 defines a third trench 140. The gate oxide layer 130 may be made of an insulating material such as silicon oxide. The gate oxide layer 130 formed by using the atomic layer deposition process can effectively isolate and protect the second segment 112 of the active pillar 110 when the first gate oxide layer 130 is thin, and can avoid occupying large space, thereby facilitating subsequent filling or formation of another structure layer.

According to an exemplary embodiment, this embodiment is a further description of step S400 described above.

In step S400, a gate dielectric layer 170 is formed on the gate oxide layer 130. Along the first direction, the gate dielectric layer 170 is shorter than the gate oxide layer 130, and is close to the third segment 113.

In some embodiments, the gate dielectric layer 170 is formed by using a process including the following steps:

A first initial word line (not shown in the figure) is formed in the third trench 140 by using the atomic layer deposition process, the physical vapor deposition process, or the chemical vapor deposition process. The first initial word line fills up the third trench 140.

Figure 14:
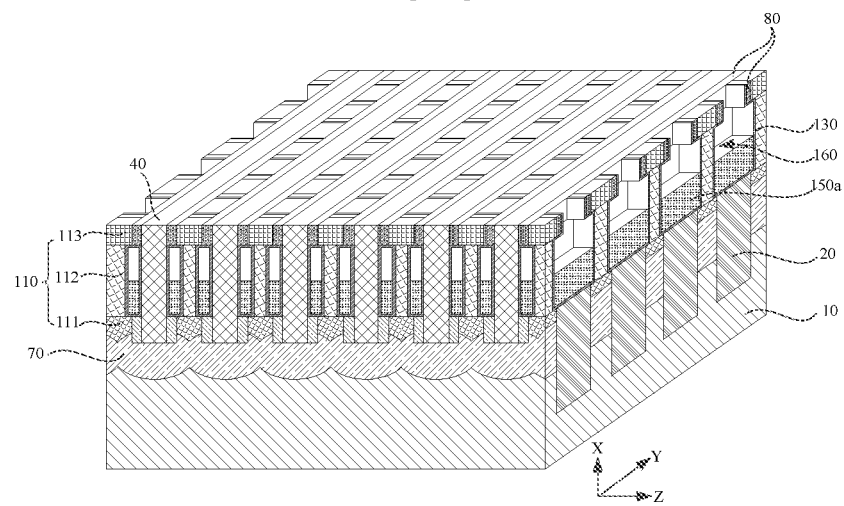
FIG. 14 is a schematic diagram of forming a first word line in the manufacturing method of a semiconductor structure according to an exemplary embodiment.

Then, with reference to FIG. 14, the first initial word line is partially removed through etching, and the retained first initial word line forms a first word line 150a. The top surface of the first word line 150a is lower than that of the second segment 112 of the active pillar 110. A fourth trench 160 is formed between the first word line 150a and the gate oxide layer 130.

The etching endpoint of the first initial word line may be located between one third and two thirds of the height of the second segment 112. In an embodiment, the etching endpoint of the first initial word line is located at a half height of the second segment 112. Thus, the retained first initial word line forms the first word line 150. A material of the first word line 150a includes, but is not limited to, tungsten or polycrystalline silicon.

Figure 15:
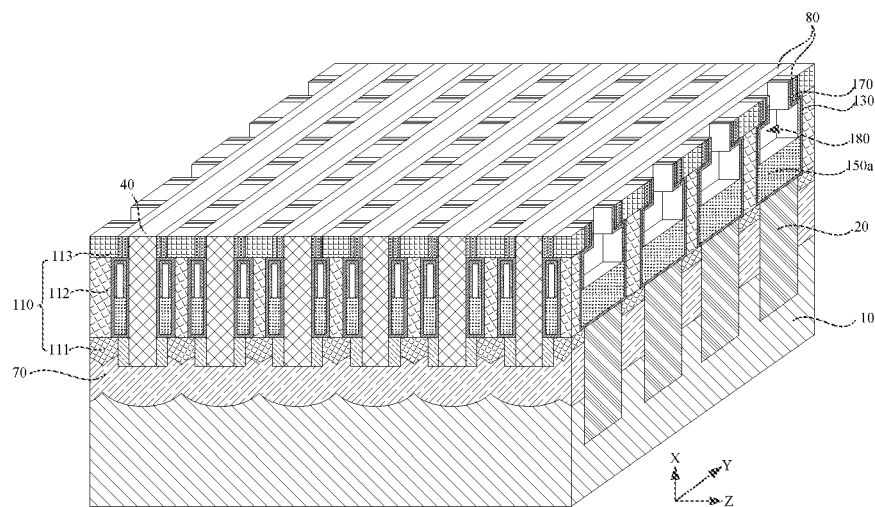
FIG. 15 is a schematic diagram of forming a gate dielectric layer in the manufacturing method of a semiconductor structure according to an exemplary embodiment.

Then, as shown in FIG. 15, the atomic layer deposition process is used to form the gate dielectric layer 170 in the fourth trench 160 and on the sidewall of the gate oxide layer 130, and the sidewall of the gate dielectric layer 170 and the top surface of the first word line 150a define a fifth trench 180.

The material of the gate dielectric layer 170 may include, but is not limited to, a dielectric material or a high-K material. The gate oxide layer 130 made of the dielectric material or the high-K material is beneficial to improving the capacitance of the subsequently formed capacitor. It should be noted that the dielectric material may be formed by a high-k dielectric material such as silicon nitride, or the dielectric material may include, but is not limited to, tantalum oxide, niobium oxide, titanium oxide, barium oxide, strontium oxide, lanthanum oxide, praseodymium oxide, or barium strontium titanate. The high-K material includes, but is not limited to, zirconium oxide, hafnium oxide, titanium zirconium oxide, ruthenium oxide, or aluminum oxide.

Because the first word line 150a is formed in the third trench 140 before the gate dielectric layer 170 is formed, the first word line 150a shields a part of the second segment 112, such that the gate dielectric layer 170 is shorter than the gate oxide layer 130 in the first direction X.

In the related art, a GIDL current exists in a GAA transistor. The reason for this kind of transistor to generate the GIDL current is that a thickness of a gate oxide layer is small, which reduces a charge storage capability of the gate oxide layer. When the GAA transistor is in a static state, electrons generated by a gate or a small quantity of carrier fluids enter a drain of the transistor through the gate oxide layer, which causes a high electric field effect to the drain of the transistor, resulting in a leakage current at the drain. In this embodiment, the gate oxide layer 130 is formed on the sidewall of the second segment 112, the top surface of the first segment 111 and the bottom surface of the third segment 113 of the active pillar 110, and then, the gate dielectric layer 170 is formed on the sidewall of the gate oxide layer 130. The gate dielectric layer 170 is formed by a dielectric material or a high-K material, which can effectively improve the capacitance of subsequent capacitors and prevent the electrons generated by the gate in the semiconductor structure or the small quantity of carrier fluids from entering the source or the drain through the gate oxide layer 130, thereby effectively reducing the GIDL current, and improving the performance and the yield of the semiconductor structure.

After the fifth trench 180 is formed, a second initial word line (not shown in the figure) is formed in the fifth trench 180 by using a deposition process, and the second initial word line fills up the fifth trench 180. The material of the second initial word line includes, but is not limited to, tungsten or polysilicon.

Figure 16:
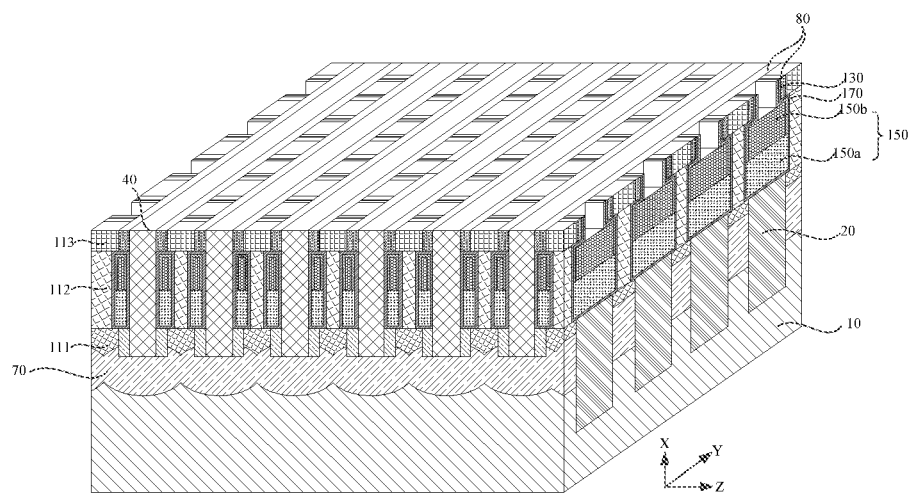
FIG. 16 is a schematic diagram of forming a second word line in the manufacturing method of a semiconductor structure according to an exemplary embodiment.

Then, as shown in FIG. 16, the second initial word line is partially removed. The etching endpoint of the second initial word line is flush with a junction between the second segment 112 and the third segment 113. The retained second initial word line forms a second word line 150b, and the first word line 150a and the second word line 150b form a word line structure 150.

In the related art, a gate structure with dual work functions is generally obtained by depositing word line metal layers of different materials at the gate. In addition, a process required for depositing the metal layers of different materials is relatively complex, and an isolation layer is required between the metal layers of different materials due to a diffusion problem.

In this embodiment, the word line structure 150 is formed by metal tungsten or polysilicon through two depositions, such that a thickness of the word line does not affect the potential of the word line structure 150. In this case, the gate oxide layer 130 is formed on the sidewall of the second segment 112, the top surface of the first segment 111 and the bottom surface of the third segment 113, and then, the gate dielectric layer 171 is formed on the sidewall of the gate oxide layer 130 partially corresponding to the second segment 112 connected to the third segment 113, such that the two ends of the second segment 112 have different charge storage capacities. The charge storage capacity of the part of the second segment 112 connected to the third segment 113 is greater than that the part of the second segment 112 connected to the first segment 111, thereby forming a gate structure of which a function conforms to the dual work function. Therefore, the processing process is simple and easy to control and perform.

Therefore, when the transistor formed by the semiconductor structure in this embodiment, such as the GAA transistor, is used, the charge storage capacity of the channel region close to the source increases. To turn on the transistor, an additional turn-on voltage VT of a source terminal increases, which correspondingly increases a potential of a part of the word line structure 150 close to the third segment 113, thereby forming a potential difference between the word line structures 150 at two ends of the second segment 112.

Further, when the additional turn-on voltage VT of the source terminal increases, a source voltage Vs of the source terminal increases. A relationship shown in the following formula exists between the turn-off current (I off) and the source voltage Vs, namely:

$$I\ off \propto 4e^{-(Vs*\varepsilon/kt)}$$

In the above formula, ε/kt represents a constant, which is about 0.0256. Therefore, when the source voltage Vs of the source terminal increases, the turn-off current (I off) decreases. Since the turn-off current and the source voltage Vs meet an exponential relationship of e, when the thickness of the gate oxide layer of the source terminal of the transistor increases, the turn-off current decreases exponentially, so as to facilitate the control of the turn-off current of the semiconductor structure, thereby reducing the GIDL current and inter-band tunneling of the semiconductor structure and improving the performance and the yield of the semiconductor structure.

Figure 17:
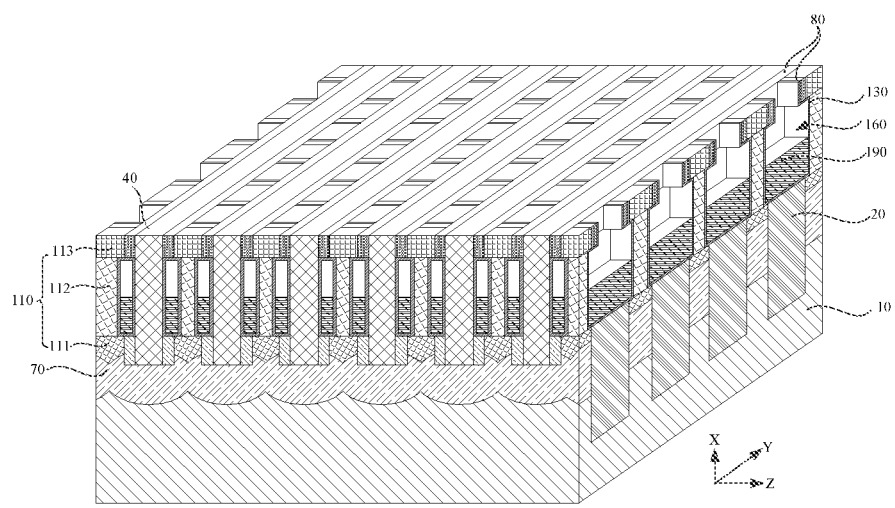
FIG. 17 is a schematic diagram of forming a sacrificial layer and a fourth trench in the manufacturing method of a semiconductor structure according to an exemplary embodiment.

The gate dielectric layer 170 is formed by another process including the following steps:

As shown in FIG. 17, a sacrificial layer 190 is formed in the third trench 140 by using a deposition process. The top surface of the sacrificial layer 190 is lower than that of the second segment 112. The sacrificial layer 190 and the sidewall of the gate oxide layer 130 define a fourth trench 160. In some embodiments, the top surface of the sacrificial layer 190 may be between one-third to two-thirds of the height of the second segment 112. In an example, the top surface of the sacrificial layer 190 is located at one-half the height of the second segment 112. A material of the sacrificial layer 190 may include, but is not limited to, polycrystalline silicon.

Figure 18:
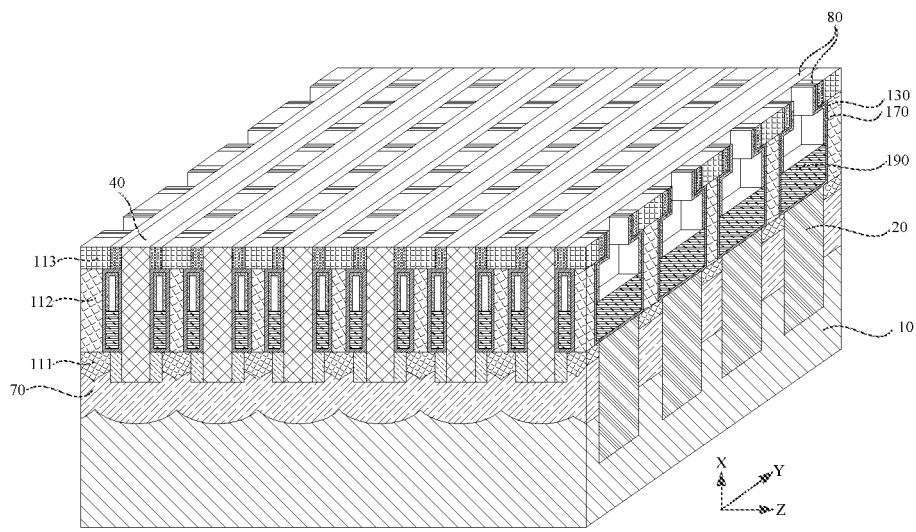
FIG. 18 is a schematic diagram of forming the gate dielectric layer in the manufacturing method of a semiconductor structure according to an exemplary embodiment.

As shown in FIG. 18, the atomic layer deposition process is used to form a gate dielectric layer 170 in the fourth trench 160 and on the sidewall of the gate oxide layer 130.

Figure 19:
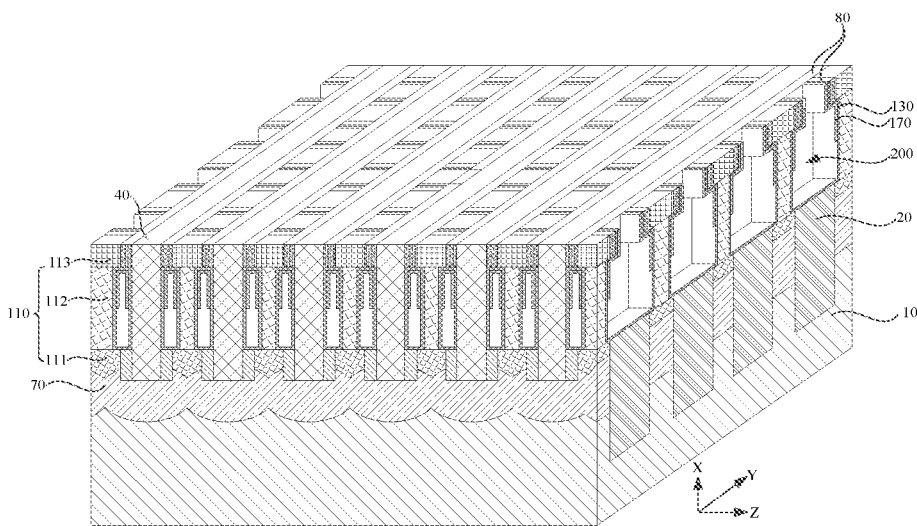
FIG. 19 is a schematic diagram of forming a sixth trench in the manufacturing method of a semiconductor structure according to an exemplary embodiment.

As shown in FIG. 19, the sacrificial layer 190 is etched. The sidewall of the gate dielectric layer 170 and a sidewall of the gate oxide layer 130 where the sacrificial layer 190 is removed define a sixth trench 200.

Figure 20:
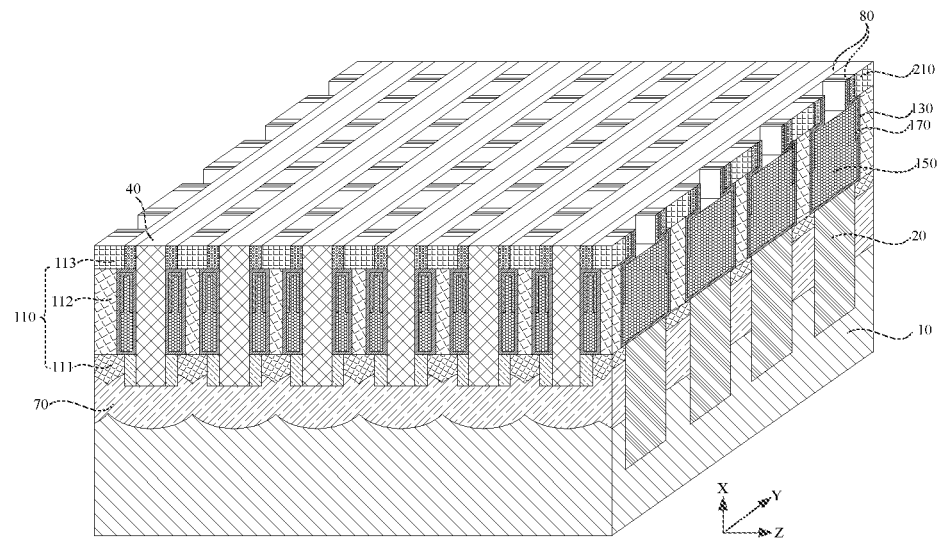
FIG. 20 is a schematic diagram of forming a word line structure in the manufacturing method of a semiconductor structure according to an exemplary embodiment.
Figure 21:
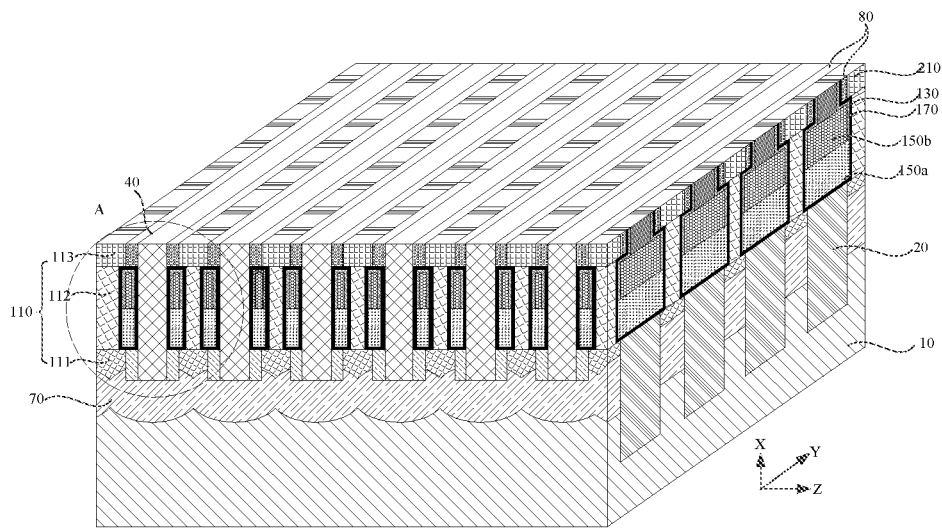
FIG. 21 is a schematic diagram of forming a second isolation layer in the manufacturing method of a semiconductor structure according to an exemplary embodiment.
Figure 22:
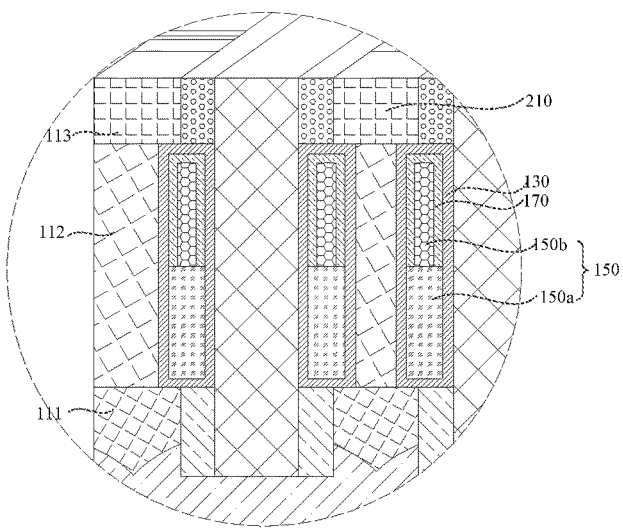
FIG. 22 is an enlarged view of a part A in FIG. 21.
Figure 23:
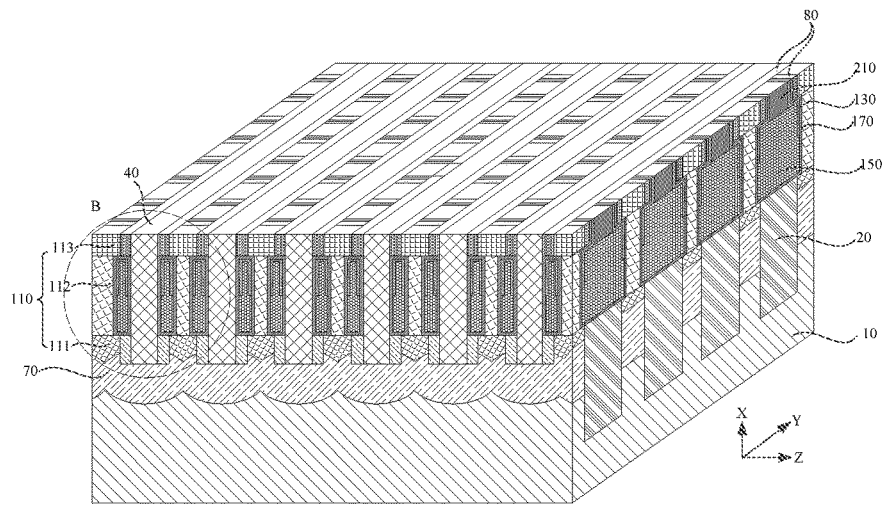
FIG. 23 is a schematic diagram of forming another word line structure in the manufacturing method of a semiconductor structure according to an exemplary embodiment.
Figure 24:
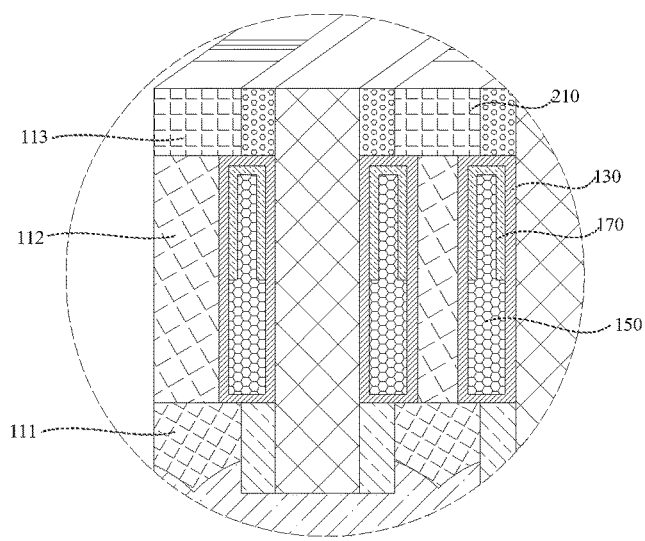
FIG. 24 is an enlarged schematic view of a part B in FIG. 23.

As shown in FIG. 20, a word line structure 150 is formed in the sixth trench 200 by using a deposition process. The material of the word line structure 150 may include, but is not limited to, tungsten or polysilicon. In this embodiment, the word line structure 150 is formed once through a deposition process, which is simple and convenient to control the formation quality of the word line structure 150.

In some embodiments, as shown in FIGS. 21 to 24, a second isolation layer 210 is formed on the word line structure 150, and the top surface of the second isolation layer 210 is flush with that of the active pillar 110.

After the word line structure 150 is formed, a second isolation layer 210 may be formed on a top surface of the word line structure 150 by using atomic layer deposition process, the physical vapor deposition process, or the chemical vapor deposition process. Then, the top surface of the second isolation layer 210 is processed through chemical mechanical polishing, such that a top surface of the retained second isolation layer 210 is flush with that of the active pillar 110.

The second isolation layer 210 is formed on the word line structure 150, such that another structure of the semiconductor structure is formed subsequently on the substrate 10, and the word line structure 150 is insulated from another structure on the second isolation layer 210. A material of the second isolation layer 210 includes, but is not limited to, silicon nitride, silicon dioxide, or silicon oxynitride.

As shown in FIGS. 21 to 24, an embodiment of the present disclosure provides a semiconductor structure, including a substrate 10, an active pillar 110, a gate oxide layer 130, and a gate dielectric layer 170.

For example, a plurality of active pillars 110 are provided and are arranged in an array in the substrate 10. Along the first direction X, the active pillar 110 includes a first segment 111, a second segment 112, and a third segment 113 that are connected sequentially. The first segment 111 is connected to the substrate 10. The first segment 111 may form the drain of the active pillar 110. The second segment 112 may form the channel region. The third segment 113 may form the source.

The gate oxide layer 130 is disposed on a sidewall of the second segment 112, a top surface of the first segment 111, and a bottom surface of the third segment 113.

The gate dielectric layer 170 is disposed outside the gate oxide layer 130. Along the first direction X, the gate dielectric layer 170 is shorter than the gate oxide layer 130, and is close to the third segment 113.

In this embodiment, the gate oxide layer is formed on the sidewall of the second segment, the top surface of the first segment, and the bottom surface of the third segment of the active pillar, and then the gate dielectric layer is formed on the sidewall of the gate oxide layer. The gate dielectric layer is shorter than the gate oxide layer, and the gate dielectric layer is close to the third segment, such that two ends of the second segment have different capacitances, to have different potentials, which is beneficial to controlling the turn-off current of the semiconductor structure, and reducing the problems of GIDL current and inter-band tunneling, thereby effectively improving the performance and yield of the semiconductor structure.

As shown in FIGS. 21 to 24, in some embodiments, the semiconductor structure further includes a plurality of bit line isolation structures 20 and a plurality of word line isolation structures 40.

The bit line isolation structures 20 are arranged at intervals along the second direction Y, and are configured to insulate adjacent bit lines formed subsequently in the substrate 10, thereby ensuring the performance of the semiconductor structure.

The word line isolation structures 40 are arranged at intervals along the third direction Z, and are configured to insulate adjacent word lines formed subsequently in the substrate 10, thereby ensuring the performance of the semiconductor structure.

As shown in FIGS. 21 to 24, in some embodiments, the semiconductor structure further includes a plurality of bit lines 70. The plurality of bit lines 70 are arranged at intervals along the second direction Y. The bit line 70 is located below the active pillar 110, and is configured to connect the first segments 111 of the plurality of active pillars 110, extending along the third direction Z, on a same line.

As shown in FIGS. 21 to 24, in some embodiments, the semiconductor structure further includes a plurality of word line structures 150 arranged at intervals along the third direction Z. The word line structure 150 surrounds the second segment 112 of the active pillar 110, such that a GAA transistor structure can be formed.

The word line structure 150 includes a first word line 150*a* and a second word line 150*b*. The bottom surface of the first word line 150*a* is close to the first segment 111, and the top surface of the second word line 150*b* is close to the third segment 113. Taking a plane perpendicular to the second direction Y as a longitudinal section, the longitudinal cross-sectional area of the first word line 150*a* is greater than that of the second word line 150*b*.

It should be noted that, in this embodiment, the first word line 150*a* and the second word line 150*b* may be formed by one deposition, or may be formed by two depositions. The longitudinal cross-sectional area of the first word line 150*a* is greater than that of the second word line 150*b*. In this case, along the first direction X, the sidewall of the gate oxide layer 130 is as long as the sum of the lengths of the first word line 150*a* and the second word line 150*b*, and the gate dielectric layer 170 is as long as the second word line 150*b*, such that charge storage capacities at two ends of the second segment 112 are different, thereby making potentials at two ends of the second segment 112 different either, which is beneficial to controlling the turn-off current of the semiconductor structure, and reducing the problems of GIDL current and inter-band tunneling, thereby effectively improving the performance and yield of the semiconductor structure.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A manufacturing method of a semiconductor structure, comprising:
   providing a substrate;
   forming a plurality of active pillars on the substrate, wherein the active pillars are arranged in an array, the active pillar comprises a first segment, a second segment, and a third segment that are sequentially connected along a first direction, and along a second direction, a cross-sectional area of the second segment is smaller than those of the first segment and the third segment;
   forming a gate oxide layer on a sidewall of the second segment, a top surface of the first segment, and a bottom surface of the third segment; and
   forming a gate dielectric layer on the gate oxide layer, wherein along the first direction, the gate dielectric layer is shorter than the gate oxide layer, and is close to the third segment;
   wherein the forming a plurality of active pillars on the substrate comprises:
   forming a plurality of bit line isolation structures arranged at intervals along the second direction in the substrate, wherein the substrate between adjacent two of the bit line isolation structures forms a strip body;

processing the strip body to form a silicon pillar structure, wherein the silicon pillar structure comprises a first part, a second part, and a third part along the first direction;

forming a plurality of word line isolation structures arranged at intervals along a third direction in the substrate, wherein the second direction intersects the third direction on a same horizontal plane, and the silicon pillar structure between adjacent two of the bit line isolation structures and between adjacent two of the word line isolation structures forms a silicon pillar; and preprocessing the second part of the silicon pillar to form the active pillar.

2. The manufacturing method of a semiconductor structure according to claim 1, wherein the forming a plurality of bit line isolation structures arranged at intervals along the second direction in the substrate comprises:

forming a plurality of bit line trenches arranged at intervals along the second direction in the substrate; and forming the bit line isolation structure in the bit line trench.

3. The manufacturing method of a semiconductor structure according to claim 2, wherein the forming a plurality of word line isolation structures arranged at intervals along a third direction in the substrate comprises:

forming a plurality of word line trenches arranged at intervals along the third direction in the substrate, wherein along the first direction, the word line trench is shallower than the bit line trench;

forming a first initial isolation layer on each of two sidewalls of the word line trench, wherein the first initial isolation layer extends outside the word line trench, and covers a top surface of the silicon pillar, and a first trench is formed between adjacent two of the first initial isolation layers;

forming an initial word line isolation structure in the first trench, wherein a top surface of the initial word line isolation structure is flush with that of the first initial isolation layer; and partially removing the first initial isolation layer and the initial word line isolation structure, retaining the first initial isolation layer on each of two sidewalls of the word line trench, and retaining the initial word line isolation structure in the first trench, wherein the retained first initial isolation layer forms a first isolation layer, and the retained initial word line isolation structure forms the word line isolation structure.

4. The manufacturing method of a semiconductor structure according to claim 3, the manufacturing method further comprises:

forming a plurality of bit lines at bottoms of the first trenches, wherein the plurality of bit lines are arranged at intervals along the second direction.

5. The manufacturing method of a semiconductor structure according to claim 3, the manufacturing method further comprises:

forming a support structure, wherein the support structure covers two sides of the word line isolation structure and two sidewalls of the third part extending along the third direction.

6. The manufacturing method of a semiconductor structure according to claim 5, wherein the forming a support structure comprises:

partially removing the first isolation layer and the bit line isolation structure, to partially expose the word line isolation structure and the silicon pillar, wherein a first filling region is formed between the word line isolation structure and the silicon pillar, and a second filling region is formed between adjacent two of the third segments along the third direction; and forming the support structure in the first filling region and on a sidewall of the second filling region.

7. The manufacturing method of a semiconductor structure according to claim 5, wherein the preprocessing the second part of the silicon pillar to form the active pillar comprises:

partially removing the first isolation layer and the bit line isolation structure that are located below the support structure, to expose the second part; and partially removing the second part through oxidization, to form the active pillar, wherein the first part of the silicon pillar forms the first segment of the active pillar, the retained second part of the silicon pillar forms the second segment of the active pillar, and the third part of the silicon pillar forms the third segment of the active pillar.

8. The manufacturing method of a semiconductor structure according to claim 7, wherein a second trench is formed between the second segment and the word line isolation structure; and the forming a gate oxide layer on a sidewall of the second segment, a top surface of the first segment, and a bottom surface of the third segment comprises:

forming the gate oxide layer on a sidewall of the second trench by an atomic layer deposition process, wherein the gate oxide layer in the second trench defines a third trench.

9. The manufacturing method of a semiconductor structure according to claim 8, wherein the forming a gate dielectric layer on the gate oxide layer comprises:

forming a first initial word line in the third trench, wherein the first initial word line fills up the third trench;

partially removing the first initial word line, wherein the retained first initial word line forms a first word line, and a fourth trench is formed between the first word line and the gate oxide layer;

forming the gate dielectric layer in the fourth trench and on a sidewall of the gate oxide layer, wherein a sidewall of the gate dielectric layer and a top of the first word line define a fifth trench;

forming a second initial word line in the fifth trench; and partially removing the second initial word line, wherein the retained second initial word line forms a second word line, and the first word line and the second word line form a word line structure.

10. The manufacturing method of a semiconductor structure according to claim 8, wherein the forming a gate dielectric layer on the gate oxide layer comprises:

forming a sacrificial layer in the third trench, wherein a top surface of the sacrificial layer is lower than that of the second segment, and the sacrificial layer and the sidewall of the gate oxide layer define a fourth trench;

forming the gate dielectric layer in the fourth trench and on the sidewall of the gate oxide layer;

removing the sacrificial layer, wherein the sidewall of the gate dielectric layer and the sidewall of the gate oxide layer where the sacrificial layer is removed define a sixth trench; and forming a word line structure in the sixth trench.

11. The manufacturing method of a semiconductor structure according to claim 9, the manufacturing method further comprises:

forming a second isolation layer on the word line structure, wherein a top surface of the second isolation layer is flush with that of the active pillar.

12. The manufacturing method of a semiconductor structure according to claim 10, the manufacturing method further comprises:

forming a second isolation layer on the word line structure, wherein a top surface of the second isolation layer is flush with that of the active pillar.

\* \* \* \* \*